(12) United States Patent
Abo et al.

(10) Patent No.: US 6,882,241 B2
(45) Date of Patent: Apr. 19, 2005

(54) METHOD, MEMORY SYSTEM AND MEMORY MODULE BOARD FOR AVOIDING LOCAL INCOORDINATION OF IMPEDANCE AROUND MEMORY CHIPS ON THE MEMORY SYSTEM

(75) Inventors: Hisashi Abo, Tokyo (JP); Hiroaki Ikeda, Tokyo (JP)

(73) Assignee: Elpida Memory, Inc. (JP)

( * ) Notice: Subject to any disclaimer, the term of this patent is extended or adjusted under 35 U.S.C. 154(b) by 8 days.

(21) Appl. No.: 10/255,987

(22) Filed: Sep. 26, 2002

(65) Prior Publication Data

US 2003/0062966 A1 Apr. 3, 2003

(30) Foreign Application Priority Data

Sep. 27, 2001 (JP) ........................................ 2001-297498

(51) Int. Cl.[7] .............................. H03H 7/38; H03H 5/00
(52) U.S. Cl. ............................ 333/33; 326/30; 333/247
(58) Field of Search ........................... 333/33, 34, 247; 326/30

(56) References Cited

U.S. PATENT DOCUMENTS

| 6,392,897 | B1 | 5/2002 | Nakase et al. | ............. | 361/785 |
|---|---|---|---|---|---|
| 6,680,623 | B1 | * 1/2004 | Hirai et al. | ................... | 326/30 |
| 6,686,762 | B1 | * 2/2004 | Leddige et al. | ................ | 326/30 |
| 2001/0021105 | A1 | 9/2001 | Ikeda | ........................ | 361/772 |

FOREIGN PATENT DOCUMENTS

| JP | 07-262776 | 10/1995 | ......... G11C/11/409 |
|---|---|---|---|
| JP | 11-251539 | 9/1999 | ........... H01L/27/10 |
| JP | 2000-122761 | 4/2000 | ............. G06F/3/00 |
| JP | 2001-183422 | 7/2001 | ........... G01R/31/28 |
| JP | 2001-184297 | 7/2001 | ........... G06F/13/16 |
| JP | 2001-256772 | 9/2001 | ............. G11C/5/00 |
| JP | 2001257018 | 9/2001 | ........... H01R/12/16 |

OTHER PUBLICATIONS

Article from Interface, Apr. 1999, pp. 183–193.

* cited by examiner

*Primary Examiner*—Stephen E. Jones
(74) *Attorney, Agent, or Firm*—Hayes Soloway P.C.

(57) ABSTRACT

A signal line of a data bus includes first wires on a first board and a second wire on a second board. The second board is installed on the first board to connect the first and second wires with each other in series to establish the signal line. Semiconductor devices are connected with the second wire. In such data bus system, impedance of the second wire is decided according to additional capacitance of the semiconductor device on the second board in order to harmonize impedance of the first board with impedance of the second board.

16 Claims, 10 Drawing Sheets

$Zm=sqrt(Lm/Cm)$
$Zef=sqrt(L0/(C0+Cin/Ep))$

6-Layer Stackup(STD)

| Layer | X-section | Thickness |
|---|---|---|
| Layer 1 | | 38 |
| | | 200 |
| Layer 2 | | 35 |
| | | 200 |
| Layer 3 | | 35 |
| | | 200 |
| Layer 4 | | 35 |
| | | 200 |
| Layer 5 | | 35 |
| | | 200 |
| Layer 6 | | 38 |
| total 1.216(mm) | | |

FIG. 6A

8-Layer Stackup(STD)

| Layer | X-section | Thickness |
|---|---|---|
| Layer 1 | | 38 |
| | | 80 |
| Layer 2 | | 35 |
| | | 130 |
| Layer 3 | | 35 |
| | | 200 |
| Layer 4 | | 35 |
| | | 130 |
| Layer 5 | | 35 |
| | | 200 |
| Layer 6 | | 35 |
| | | 130 |
| Layer 7 | | 35 |
| | | 80 |
| Layer 8 | | 38 |
| total 1.236(mm) | | |

FIG. 6B

METHOD, MEMORY SYSTEM AND MEMORY MODULE BOARD FOR AVOIDING LOCAL INCOORDINATION OF IMPEDANCE AROUND MEMORY CHIPS ON THE MEMORY SYSTEM

BACKGROUND OF THE INVENTION

This invention relates to wiring of a data bus and, in particular, wire structure of a data bus on a motherboard and a memory module board plugged into a connector on the motherboard. Typically, a personal computer includes a motherboard and memory module boards.

In recent years, the processing speed of a CPU (central processing unit) has accelerated, and as a result, it is required that the frequency response of a data bus becomes faster. In this specification, it is assumed that the frequency response of a data bus is over 100 MHz.

In a conventional data bus of a personal computer, the T-stub wiring structure shown in FIG. 1 is adopted for branching bus lines and control lines for DRAM (dynamic random-access memory). The following describes a memory module 80 with the T-stub wiring structure with reference to FIG. 1.

A connector 83 is installed on a bus line 82 wired on a main board 81. A memory module board 84 is plugged into the connector 83. One end of a line 86 on the memory module board 84 is connected with the bus line 82 at a contact 85. This connection forms an inverted letter "T" on FIG. 1. The other end of the line 86 is connected with a lead pin 88 of a DRAM chip 87. Thus the line 86 is branched out from the bus line 82 at the connector 83 to form the letter "T".

The T-stub wiring structure causes limitation of signal transmission in the memory module 80. Therefore, for example, if the control clock of the memory module 80 is about 100 MHz, then the maximum number of the memory module 80 that can be connected with the bus line 82 is about four. If the control clock is over 133 MHz, then the maximum number is about 2. The maximum data rate that can be read or written through the bus line 82 is about 20 Mbps/pin.

In the Japanese unexamined patent publication number H11-251539, namely 251539/1999, another memory module 90 is disclosed as shown in FIG. 2. On one hand in the memory module 80, the bus line 82 is continuously wired on the main board 81. The section between opposite contacts of the connector 83 on the main board 81 is wired the bus line 82. On the other hand, in the memory module 90, a bus line 92 is divided between opposite contacts of a connector 93 on a main board 91. Instead, a through line 99 is wired from one side to the other side of a memory module board 94. Thus, in the memory module 90, one wiring pass via a contact 95, a line 96 and a lead pin 98 forms a stub wiring structure, and another wiring pass via the bus line 92, the connector 93, a contact 95, the through line 99, a contact 95, the connector 93 and the bus line 92 forms a stubless wiring structure.

According to the Japanese unexamined patent publication No. H11-251539, it is said that the memory module 90 has less signal reflection or signal distortion caused by incoordination of impedance in a stub wiring structure than the memory module 80.

The Japanese Unexamined Patent Publication (JP-A) Number 2001-257018 discloses another memory module 100 as shown in FIG. 3.

Compared with FIG. 2, in the memory module 100, a through line 109 is wired at a different position on a memory module board 104. In the memory module 90, the through line 99 is wired so as to connect contacts 93 on both side with each other. On the other hand, in the memory module 100, the through line 109 is wired at the position where a lead pin 108 is connected to a line 106.

In the memory module 100, only the lead pin 108 is stub-wired. The rest of the wiring pass has a stubless wiring structure. Therefore, the memory module 100 has less incoordination of impedance caused by a stub wiring structure than the memory module 90. As a result, in the memory module 100, less signal reflection and signal distortion occur than in the memory module 90.

When a DRAM chip is connected to a bus line, the input capacitance of the DRAM chip causes additional capacitance to the bus line. Additional capacitance causes incoordination of impedance around the DRAM chip. The incoordination of impedance causes signal reflection and, exercises a harmful influence on frequency response of the data bus. In the memory modules 80, 90 and 100, however, the incoordination of impedance around the DRAM chip is not taken into consideration.

It is one object of the present invention to provide a data bus structure that can avoid harmful influence caused by additional capacitance of an integrated circuit such as a DRAM chip on the data bus.

SUMMARY OF THE INVENTION

This invention provides techniques for avoiding local incoordination of impedance around memory chips on the memory system.

According to one aspect of this invention, the present invention provides a method of wiring a signal line of a data bus. The signal line includes first wires laid on a first board and second wires laid on at least one second board. The second board is installed on the first board to connect the first and second wires with each other in series to establish the signal line. At least one semiconductor device is connected with the second wire. According to the present invention, the method includes the step of wiring a wire whose impedance is decided according to additional capacitance of the semiconductor device on the second board as the second wire in order to harmonize impedance of the first board with impedance of the second board.

Actually, impedance of the second wire may be larger than impedance of the first board.

Preferably, the first wire and the second wire are connected with each other in a stubless wiring structure.

The second wire may include at least one section at least one of whose width, thickness and length is decided according to the additional capacitance. In this case, the whole of the second wire may correspond to the section.

Further, the second board may include at least one inner layer. In this case, at least one part of the section is laid on the inner layer.

At least two semiconductor devices may be embedded on the second board. In this case, the section may be prepared for the whole of the semiconductor devices. Alternatively, when the second wire includes the same number of the sections as the semiconductor devices, each of the sections may be prepared for one of the semiconductor devices.

According to another aspect of this invention, the present invention provides a data bus system including: a first wire laid on a first board as a part of a signal line of a data bus;

a second wire laid on a second board which is installed on the first board as a part of the signal line; and a semiconductor device embedded on the second board and connected with the second wire, wherein impedance of the second wire is larger than impedance of the first board.

According to another aspect of this invention, the present invention provides a memory module board, on which at least one memory chip is embedded, for use in being plugged into a connector on a predetermined motherboard to establish a data bus to the memory chip, wherein impedance of wire on the memory module board is larger than impedance of the motherboard.

BRIEF DESCRIPTION OF THE DRAWING

FIG. 6A shows a cross-section view of a standard 6-layer stackup;

FIG. 6B shows a cross-section view of a standard 8-layer stackup;

DESCRIPTION OF THE PREFERRED EMBODIMENTS

Figure 1:
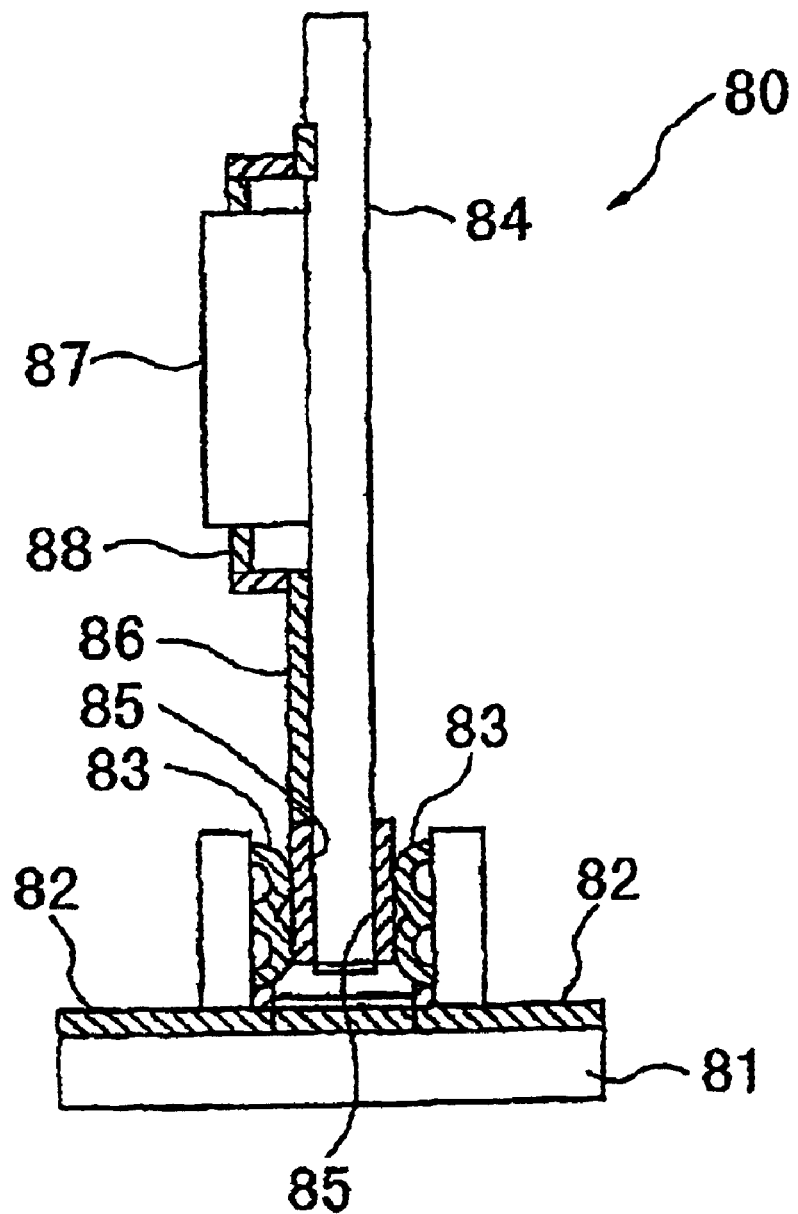
FIG. 1 shows a cross-section view for use in describing a T-stub wiring structure of a data bus.
Figure 2:
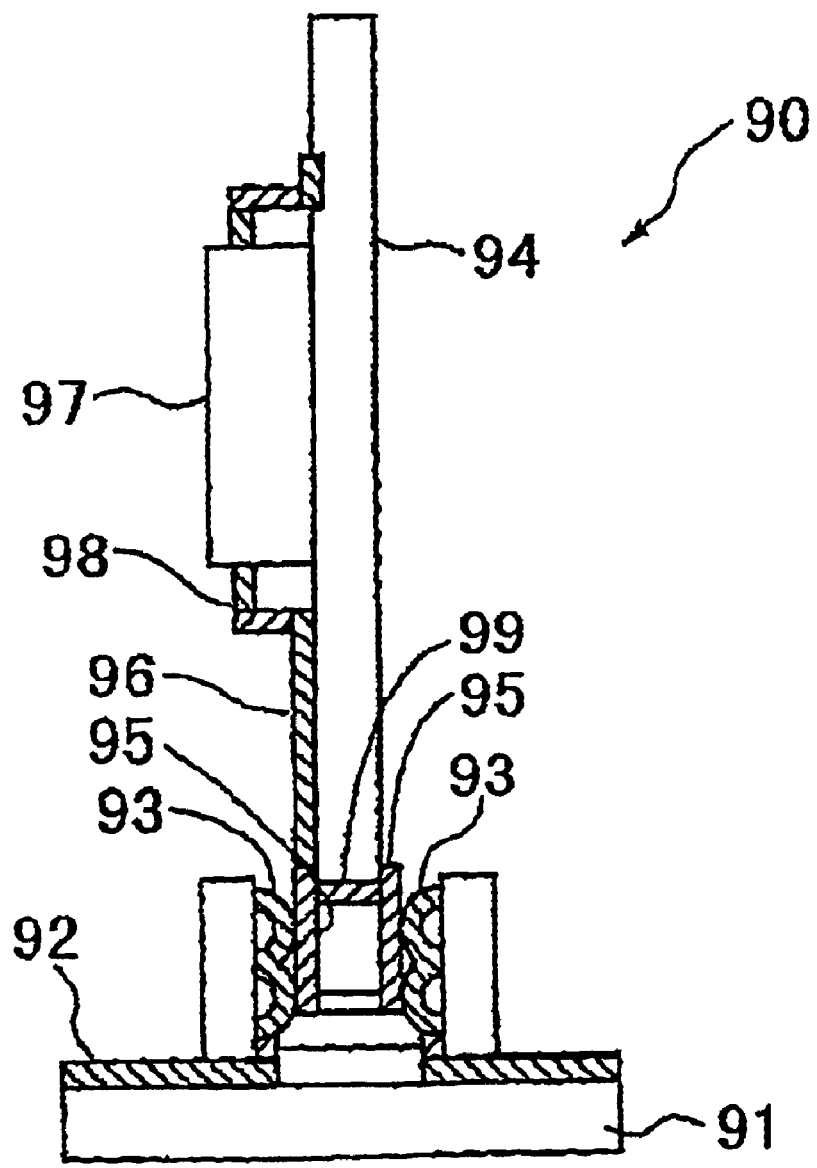
FIG. 2 shows a cross-section view for use in describing another wiring structure of a data bus.
Figure 3:
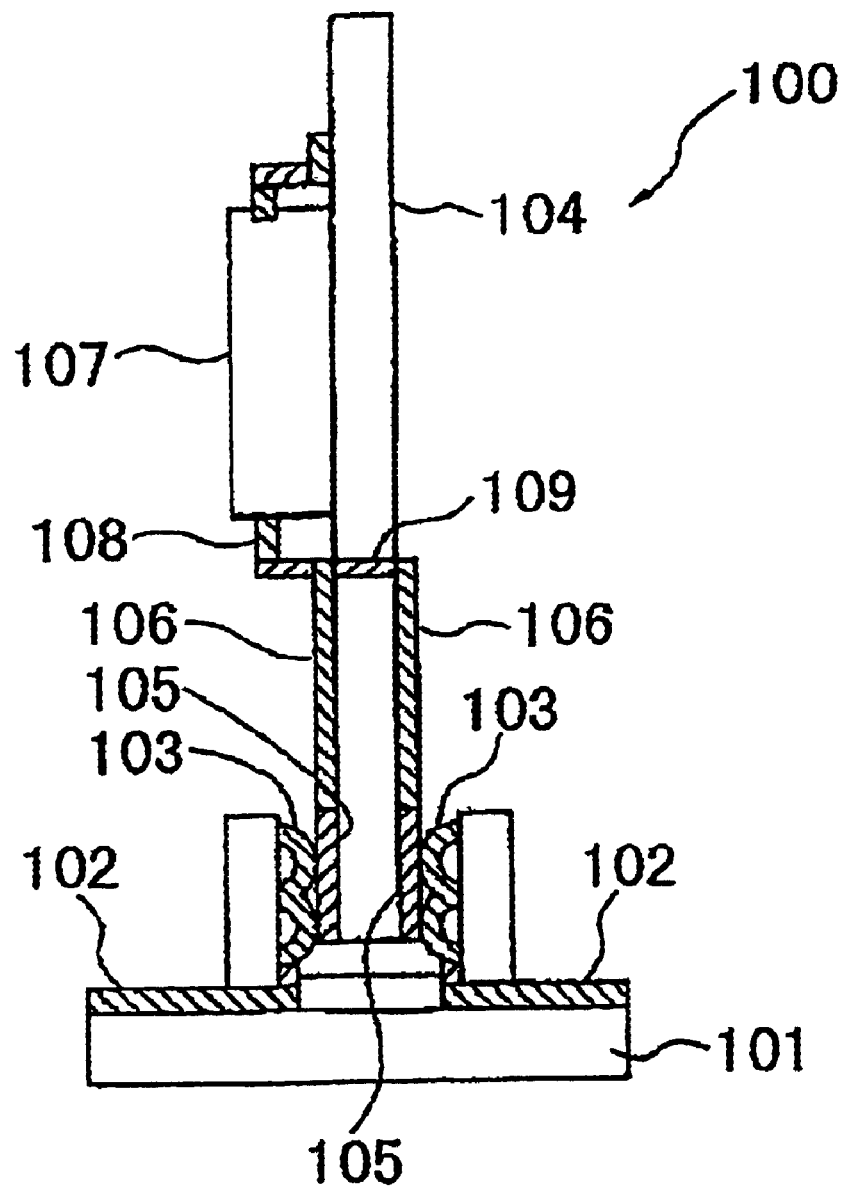
FIG. 3 shows a cross-section view for use in describing another wiring structure of a data bus.
Figure 4A:
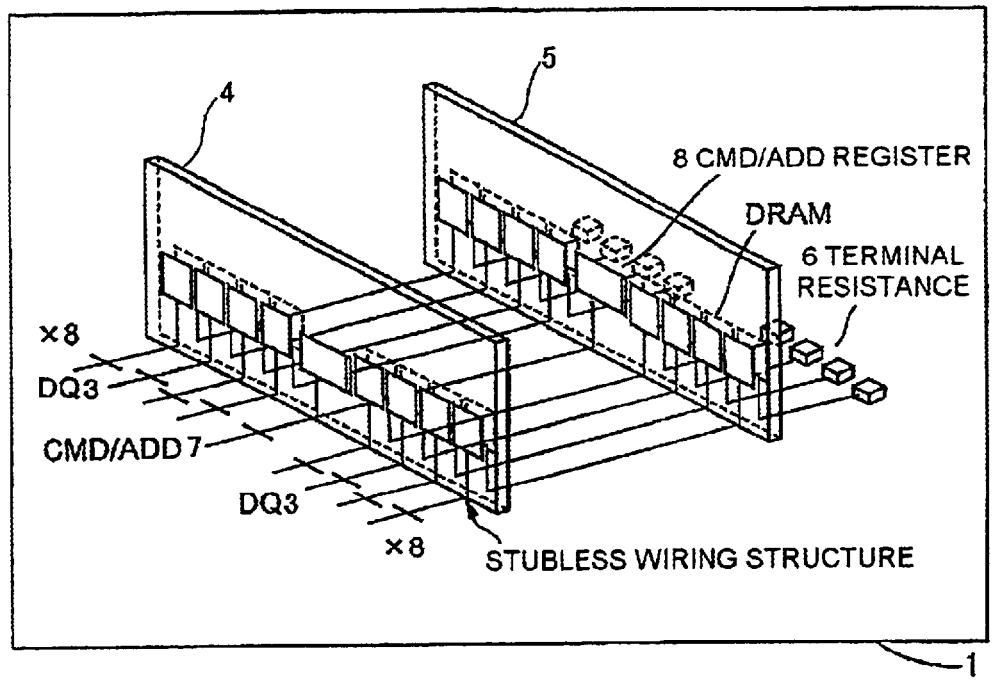
FIG. 4A shows a perspective view for use in describing a stubless wiring structure of a data bus of the present invention.
Figure 4B:
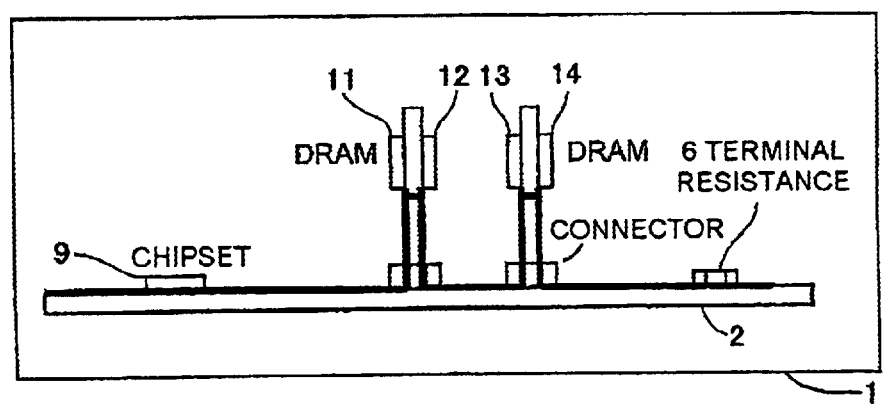
FIG. 4B shows a cross-section view for use in describing the stubless wiring structure of a data bus shown in FIG. 4A.

Description will be made about a data bus system 1, which is suitable for the present invention. As shown in FIG. 4A, in a data bus system 1, each of eight DQ lines 3 wired on a motherboard 2 is connected via two memory module boards 4 and 5 to a terminal resistance 6. Each of CMD/ADD lines 7 is connected to CMD/ADD registers 8 on the memory module boards 4 and 5. As shown in FIG. 4B, DQ lines 3 are stubless-wired. Namely, a DQ line 3 running from a chipset 9 is wired through lead pins of DRAM chips 11 and 12 on the memory module 4 and DRAM chips 13 and 14 on the memory module 5 to the terminal resistance 6, as if the DQ line 3 were drawn without lifting pen from paper.

Generally, a DRAM chip has additional capacitance, and consequently, causes a decrease in impedance. According to the present invention, the decrease in impedance is canceled by the impedance of the wire on a memory module board. As a result, impedance of a motherboard and impedance of a memory module board including DRAM chips on the memory module board are coordinated with each other.

Figure 5:
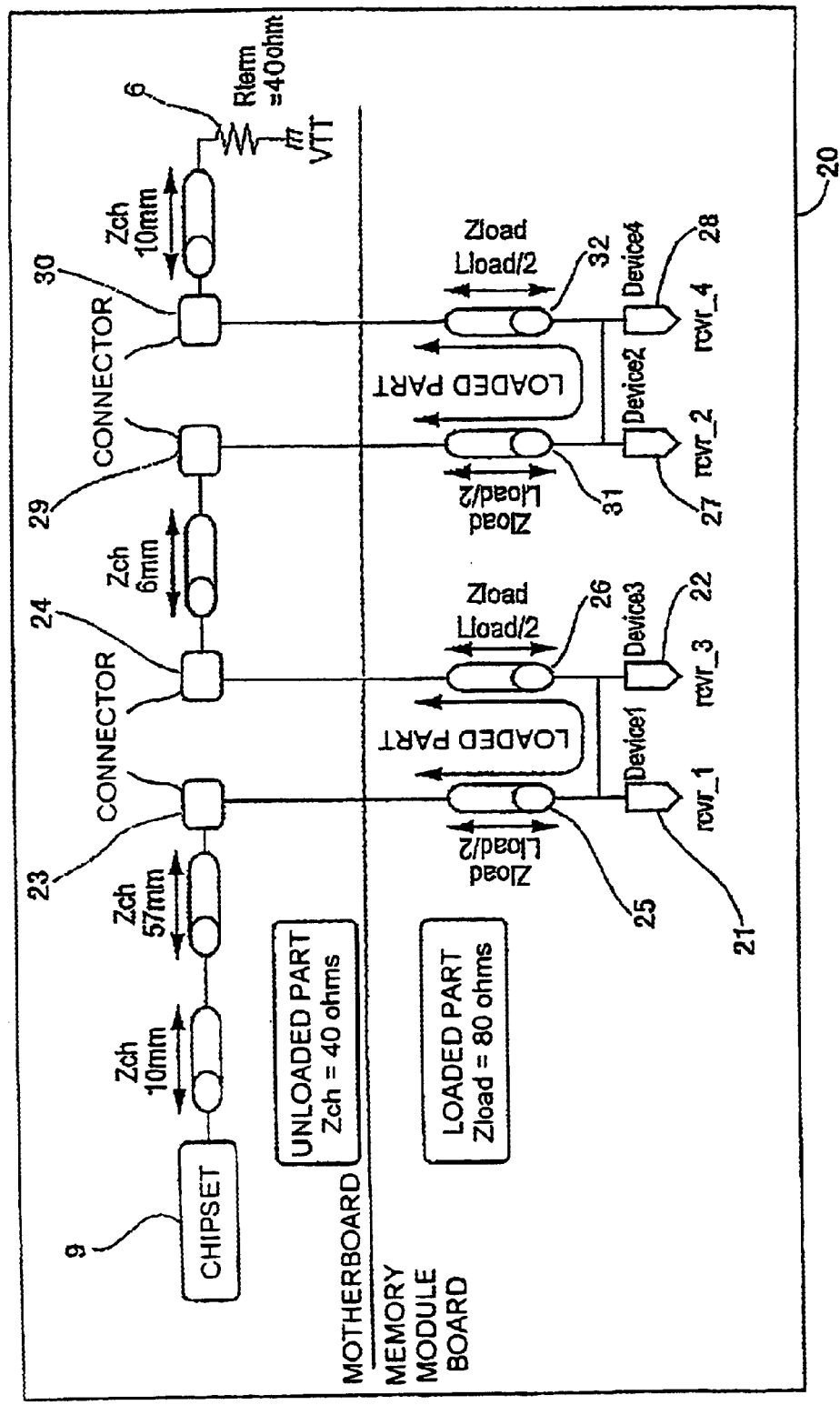
FIG. 5 shows a block diagram of a data bus system 1, a first embodiment of the present invention.

One embodiment of the present invention, a data bus system 20 is applicable to the data bus system 1. As shown in FIG. 5, DRAM chips 21 and 22 are allocated in immediate proximity to each other. Each of the DRAM chips 21 and 22 acts as a factor in decreasing impedance of the memory module board on which the DRAM chips are mounted. In other words, the memory module board includes merged DRAM chips.

It is assumed that the impedance of the wire on the motherboard of the system 1 is 40 ohms, and the additional capacitance caused by the DRAM chips 21 and 22 is 4.5 picofarads. When each of the wires 25 and 26 on a memory module board is 20 millimeters in length and 80 ohms in impedance, effective impedance of the memory module board including the DRAM chips 21 and 22 also becomes 40 ohms. The additional capacitance of DRAM chips 27, 28 may be the same as those of the DRAM chips 21, 22. Also, the length of wires 31 and 32 may be the same as those of the wires 25 and 26. Consequently, the effective impedance of the system 1 can be coordinated as a whole.

There are two standard structures of a memory module board. One is a 6-layer stackup (STD) as shown in FIG. 6A and the other is an 8-layer stackup as shown in FIG. 6B. The following will describe how to decide suitable combination between wire impedance of a motherboard (Z0unload), wire impedance of a memory module board installed on the motherboard (Z0load), length and width of wire on the memory module board.

The following Tables 1 and 2 show relationship between wire impedance Z0load, wire width Wmicro and electrical pitch Ep when effective impedance of wire of a memory module board, which includes decrement of impedance caused by additional capacitance of DRAM chips, corresponds with motherboard impedance Z0unload.

TABLE 1

DQ 1Bank,1 × 64 U/D Case

| Z0unload | Z0load | 30 ohm | 40 ohm | 50 ohm |
|---|---|---|---|---|
| 28 ohm | Ep | 81.1 mm | 15.4 mm | 9.1 mm |
| 0.92 mm | Wmicro(6) | | 0.524 mm | |
| 0.38 mm | Wmioro(8) | | 0.216 mm | |
| Z0unload | Z0load | 50 ohm | 60 ohm | 70 ohm |
| 40 ohm | Ep | 35.6 mm | 19.2 mm | 13.6 mm |
| 0.524 mm | Wmicro(6) | | 0.253 mm | 0.178 mm |
| 0.216 mm | Wmicro(8) | | 0.099 mm | 0.067 mm |
| Z0unload | Z0load | 70 ohm | 80 ohm | 90 ohm |
| 50 ohm | Ep | 29.2 mm | 20.5 mm | 16.1 mm |
| 0.360 mm | Wmicro(6) | | 0.125 mm | 0.086 mm |
| 0.145 mm | Wmicro(8) | | 0.045 mm | 0.030 mm |

Ep:Electrical pitch
Wmicro(6):Microstrip Line Width in 6 layer stackup example
Wmicro(8):Microstrip Line Width in 8 layer stackup example

TABLE 2

DQ 2Bank, 1 × 64 U/D Case

| Z0unload | Z0load | 30 ohm | 40 ohm | 50 ohm |
|---|---|---|---|---|
| 28 ohm | Ep | | 15.4 mm | 17.1 mm |
| 0.92 mm | Wmicro(6) | | | 0.360 mm |
| 0.38 mm | Wmicro(8) | | | 0.145 mm |
| Z0unload | Z0load | 70 ohm | 80 ohm | 90 ohm |
| 40 ohm | Ep | 25.7 mm | 20.0 mm | 16.6 mm |
| 0.524 mm | Wmicro(6) | | 0.125 mm | 0.086 mm |
| 0.216 mm | Wmicro(8) | | 0.046 mm | 0.030 mm |

TABLE 2-continued

DQ 2Bank, 1 × 64 U/D Case

| Z0unload | Z0load | 100 ohm | 110 ohm | 120 ohm |
|---|---|---|---|---|
| 50 ohm | Ep | 25.0 mm | 21.5 mm | 18.9 mm |
| 0.360 mm | Wmicro(6) | | 0.125 mm | <0.058 mm |
| 0.145 mm | Wmicro(8) | | 0.045 mm | <0.022 mm |

Ep:Electrical pitch
Wmicro(6):Microstrip Line Width in 6 layer stackup example
Wmicro(8):Microstrip Line Width in 8 layer stackup example The wire impedance Z0load is impedance of a micro strip line on a memory module board. The wire width Wmicro is width of the micro strip line. The electrical pitch Ep is length of a section of a wire on the memory module board. The section includes DRAM chips with additional capacitance.

According to the present invention, wire capacitance and wire inductance of the section are adjusted in order to make impedance of the section and that of the whole system correspond with each other. Now it is assumed that width and thickness of the wire in the section is constant. In Table 1 it is assumed that the memory module board has one bank structure, in which DRAM chips are mounted on one side of the memory module board, and the additional capacitance is 2.4 picofarads. In Table 2, it is assumed that the memory module board has two bank structure, in which DRAM chips are mounted on both side of the memory module board, and the additional capacitance is 4.5 picofarads. Wmicro (6) expresses the width of the micro strip line on a memory module board including 6-layer stackup. Wmicro (8) expresses the width of the micro strip line on a memory module board including 8-layer stackup.

According to the present invention, decrement of impedance caused by additional capacitance of DRAM chips on a memory module board is canceled by the increment of impedance of the wire on the memory module board. As a result, effective impedance of the memory module board corresponds with wire impedance of the motherboard including the memory module board. In order to cancel the decrement of the impedance, a section of wire on the memory module board is picked up. The impedance of the section is deliberately increased. In this application, the length of the section is called as electrical pitch and the section is called as an electrical pitch section.

In the following; Gin expresses additional capacitance; C0 expresses the capacitance of a wire that has length of an electrical pitch Ep; L0 expresses inductance of a wire; and Zef expresses effective impedance including influence of additional capacitance in an electrical pitch section.

With reference to Tables 1 and 2, the following (1) to (4) are taken into consideration to decide the suitable combination.

(1) In order to prepare an electrical pitch section on a memory module board, the length of the wire on the memory module board must be longer than the electrical pitch. It is preferable that the length of the whole of the wire on the memory module board corresponds with a required electrical pitch. In a wire layout on a memory module board as shown in FIG. 4, generally, the length of the whole wire is about 10 to 30 millimeters. If the whole wire is regarded as the electrical pitch section, double-bordered boxes in Tables 1 and 2 contain electrical pitches suitable for general memory module boards.

(2) Because of restriction under the current technical level, a micro strip line on a memory module board is 0.1 millimeters width at minimum. On the other hand, a memory chip packed with CSP (chip size package) has ball terminals and requires wires passing between the ball terminals on a memory module board. Taking this into consideration, it is better to narrow the width of wires on a memory module board.

(3) Uneven quality occurs in manufacturing process. Taking this into consideration, the width of wires on a memory module board is preferably wider.

(4) It is desired that a single board is applicable to both a 1-bank memory module board and a 2-bank memory module board.

Taking the above-mentioned (1) to (4) into consideration, in the combinations shown in Table 1, the best one contains that: the impedance of a motherboard Z0unload=40 ohms; the line width on the motherboard in a 6-layer stackup is equal to 0.524 millimeters; the line width on the motherboard in a 8-layer stackup is equal to 0.216 millimeters; the impedance of a memory module board Z0load=60 ohms: the electrical pitch Ep=19.2 millimeters; the microstrip line width in 6-layer stackup Wmicro(6)=0.253 millimeters; and the microstrip line width in 8-layer stackup Wmicro(8)= 0.099 millimeters.

Similarly, in the combinations shown in Table 2, the best one contains that: Z0load=40 ohms; the line width on the motherboard in a 6-layer stackup is equal to 0.524 millimeters; the line width on the motherboard in a 8-layer stackup is equal to 0.216 millimeters; Z0load =80 ohms; Ep=20.0 millimeters; Wmicro(6)=0.125 millimeters; and Wmicro (8)=0.045 millimeters.

Figure 7:
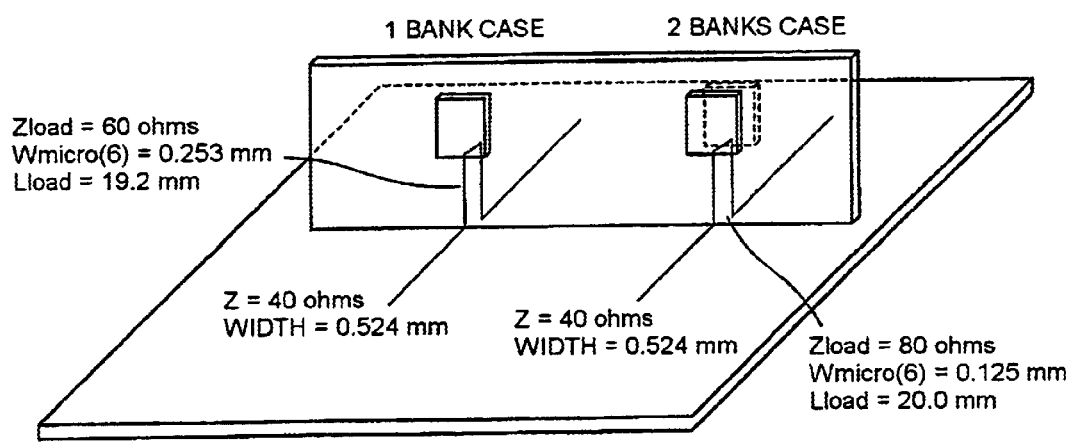
FIG. 7 shows a perspective view for use in describing the comparison of a 1-bank memory module board and a 2-bank memory module board.

In order to compare these two combinations with each other, these combinations are shown in a single drawing FIG. 7. In FIG. 7, the motherboard and the memory module board are 6-layer stackup a Lload expresses the length of the whole wire on the memory module board. In this case, the length of the whole wire corresponds to the electrical pitch as mentioned in (1).

As mentioned above, according to the data bus system 1, the first embodiment of the present invention, decrement of impedance caused by additional capacitance of DRAM chips is canceled by increment of impedance of a wire on the memory module board on which the DRAM chips are embedded. As a result, impedance of a motherboard and that of the memory module board installed on the motherboard are harmonized with each other. Therefore, a memory module board is required to have large wire impedance if the additional capacitance of a DRAM chip is large. On the other hand, however, there are limits to width and thickness of a wire on the memory module board. For example, the limitations are caused by requirement in manufacturing technique, layout requirement on the memory module board, size requirement of the memory module board, etc. The following describes that a data bus system 50, a second embodiment of the present invention, is available for a system including DRAM chips with large amount of additional capacitance.

On the 2-bank memory module board, one DRAM chip is embedded on one side of the board and another is embedded on the other side of the board, and these DRAM chips are connected with each other via through lines. In the data bus system 1, the through lines are straight lines. On the other hand, in the data bus system 50, through lines pass along redundant route in order to provide increment of impedance. The redundancy of the through lines is made with inner lines of the memory module board. Hereinafter, when on a 2-bank memory module board, two DRAM chips are close arranged and connected with each other via lines with negligible length, the structure is called as a merged chips wiring structure. When two DRAM chips are connected with each other via lines with redundant route on a 2-bank memory module board, the structure is called as a distributed chips wiring structure.

Figure 8:
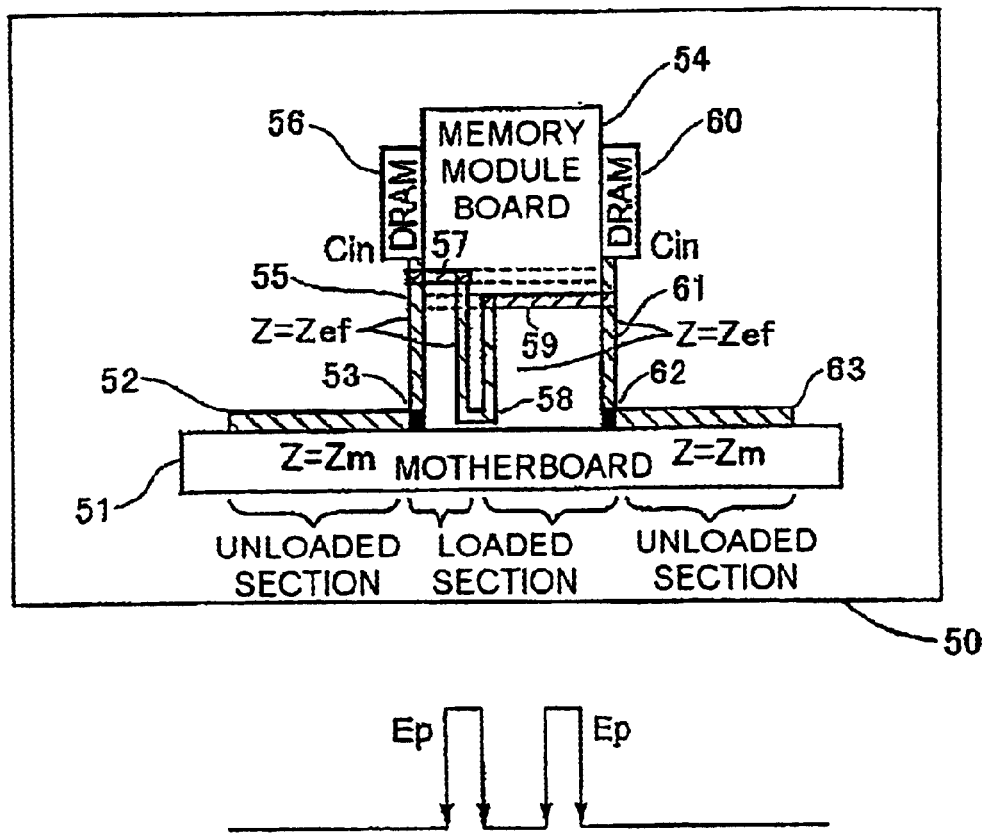
FIG. 8 shows a cross-section view for use in describing a data bus system 50, a second embodiment of the present invention.

As shown in FIG. 8, in the data bus system 50, a line 52 on a motherboard 51 is connected with one end of an outer line 55 on a memory module board 54 at a contact point 53 of a connector. The other end of the outer line 55 is connected with a lead pin of a DRAM chip 56 and one end of a line 57 arranged nearby the lead pin. The other end of the line 57 is connected with one end of an inner line 58, which is installed on inner layers of the memory module board 54. The other end of the inner line 58 is connected via a line 59 with a lead pin of a DRAM chip 60 and an outer line 61. The outer line 61 is connected with a line 63 on the motherboard 51 at a contact point 62 of the connector.

Generally, wire impedance Zm on the motherboard 51 is calculated by the following expression 1 when frequency is over 100 MHz.

$$Z_m = \sqrt{\frac{L_m}{C_m}} \qquad 1$$

On the other hand, an effective impedance Zef of the memory module board 54 in consideration of decrement of impedance caused by additional capacitance of the DRAM chips 56 and 60 is calculated by the following expression 2.

$$Z_{ef} = \sqrt{\frac{L_0}{C_0 + \frac{C_{in}}{Ep}}} \qquad 2$$

Lm expresses wire inductance of the motherboard 51, L0 expresses wire inductance of the memory module board 54, Cm expresses capacitance of the wire on the motherboard 51, C0 expresses capacitance of the wire on the memory module board 54, Cin expresses additional capacitance of DRAM chips 56 and 60, and Ep expresses an electrical pitch. One of the DRAM chips has 2.4 picofarads capacitance. When the DRAM chips are close arranged, the total of the capacitance is about 4.8 picofarads. In this situation, Zef is adjusted in order that Zef corresponds with Zm.

The data bus system 50 has a distributed chips wiring structure. Therefore, in the data bus system, the electrical pitch can be extended longer than in the data bus system 1 because of existence of additional electrical pitch caused by the inner line 58. Consequently, the data bus system 50 can be applicable for a system including DRAM chips with larger additional capacitance.

Further, according to the distributed chips wiring structure, decrement of impedance caused by one DRAM chip is canceled by the sections of the wire on the memory module board in front of and behind the DRAM chip. For example, in the data bus system 50, the decrement of impedance caused by the DRAM chip 56 is canceled by the outer line 55 and the first half of the inner line 58. In this case, the outer line 55 and the first half of the inner line 58 constitute one electrical pitch section. Similarly, the latter half of the inner line 58 and the outer line 61 constitute another electrical pitch section in order to cancel the decrement of impedance caused by the DRAM chip 60. In the distributed chips wiring structure, two electrical pitch sections each of which is connected with a DRAM chip at its center are connected with each other in series. The impedance decrement of every DRAM chip is canceled by one electrical pitch section. On the other hand, according to the merged chips wiring structure, decrement of impedance caused by two chips is canceled by one electrical pitch section.

Compared with a merged chips wiring structure, a distributed chips wiring structure requires a longer line on a memory module board. However, a distributed chips wiring structure requires less wiring impedance. For example, if the impedance of the memory module board is 80 ohms when DRAM chips are mounted on a 2-bank memory module board in the merged chips wiring structure, then the impedance of the same memory module board may change into 60 ohms when the same chips are mounted on the same board in the distributed chips wiring structure. Further, in a distributed chips wiring structure, outer and inner lines of a memory module board can become wider. Accordingly, unevenness of wire impedance can decrease and as a result, a data bus system including a distributed chips wiring structure can have better frequency response.

In both the systems 1 and 50, clock signal lines have stub wiring structure and data request lines have stubless wiring structure. The difference of wiring structure causes signal delay between a clock signal and a data request signal. Further, the wiring structure on a memory module board in the system 1 is different from that in the system 50. Therefore, the signal delay in the system 1 is different from that in the system 50. The following describes the difference between the signal delay in the system 1 and that in the system 50.

Figure 9:
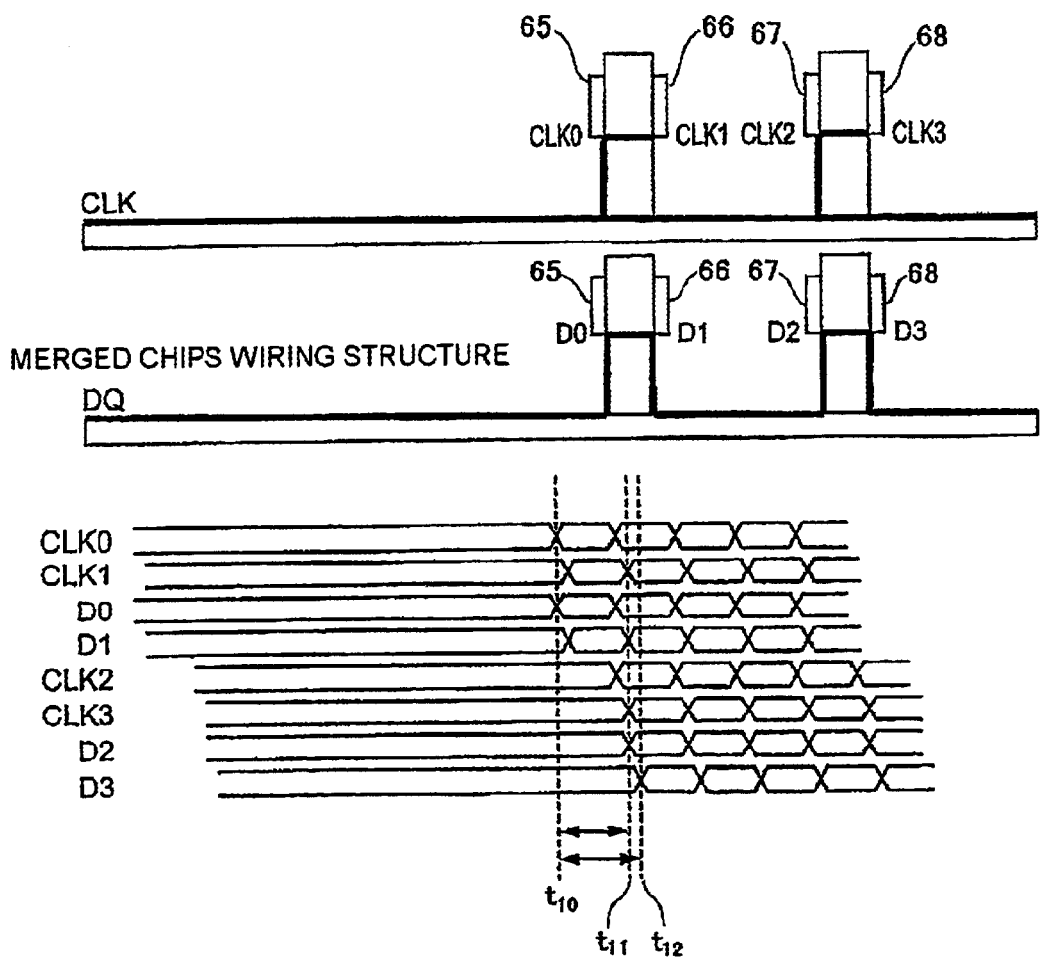
FIG. 9 shows a timing chart for use in describing time lags between a clock signal (CLK) line with a stub wiring structure and a data request signal (DQ) line with a merged stubless wiring structure.

As shown in FIG. 9, CLK and DQ lines are provided to DRAM chips 65, 66, 67 and 68 in this order and the DQ line has the merged chips wiring structure. In the timing chart in FIG. 9, both of the clock signal and the data request signal are provided to the DRAM chip 65 at the time $t_{10}$ and transmitted via the DRAM chips 66 and 67 to the DRAM chip 68. However, one hand, the clock signal arrives at the DRAM chip 68 at the time $t_{11}$ and on the other hand, the data request signal arrives at the DRAM chip 68 at the time $t_{12}$. Namely, the data request signal is delayed the time period $t_{12}$-$t_{11}$ behind the clock signal at the DRAM chip 68.

Figure 10:
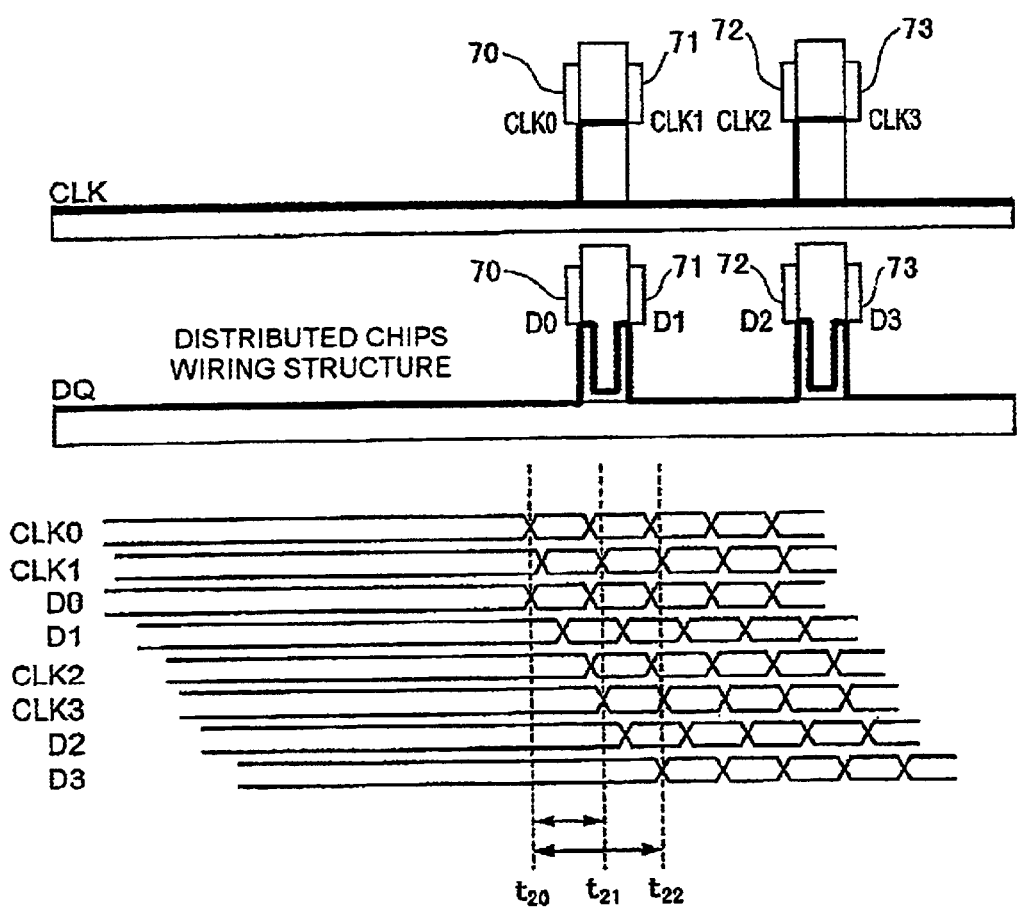
FIG. 10 shows a timing chart for use in describing time lags between a CLK line with a stub wiring structure and a DQ line with a distributed stubless wiring structure.

Similarly, as shown in FIG. 10, CLK and DQ lines are provided to DRAM chips 70, 71, 72 and 73 in this order and the DQ line has the distributed chips wiring structure. In the timing chart in FIG. 10, both of the clock signal and the data request signal are provided to the DRAM chip 70 at the time $t_{20}$ and transmitted via the DRAM chips 71 and 72 to the DRAM chip 73. However, one hand, the clock signal arrives at the DRAM chip 73 at the time $t_{21}$ and on the other hand, the data request signal arrives at the DRAM chip 73 at the time $t_{22}$. Namely, the data request signal is delayed the time period $t_{22}$-$t_{21}$ behind the clock signal at the DRAM chip 73.

The delay time in the merged chips wiring structure $t_{12}$-$t_{11}$ is shorter than that in the distributed chips wiring structure $t_{22}$-$t_{21}$. This difference of the delay time is caused by a redundant line between DRAM chips on a memory module board in the distributed chips wiring structure. Compared with the distributed chips wiring structure, the merged chips wiring structure causes less delay time, and consequently, as regards signal timing, it is easier to design a system including the merged chips wiring structure.

As mentioned above, according to the present invention, impedance of wire nearby circuit elements with additional capacitance cancels decrement of impedance caused by the additional capacitance. Therefore, the present invention can avoid local incoordination of impedance in a data bus and, as a result, can improve frequency response of the data bus.

For example, when the present invention is adopted to a memory bus of a personal computer, decrement of impedance caused by additional capacitance of DRAM chips can be canceled by the wire on a memory module board on which the DRAM chips are mounted. This cancellation is made by adjusting length, width and/or thickness of the wire.

In case of a 2-bank memory module board, one of the merged chips wiring structure and the distributed chips wiring structure may be chosen. According to the merged chips wiring structure, the decrement of impedance is canceled only by outer lines on a memory module board. Therefore, a signal skew between a clock signal transmitted through a stub-wired line and a data request signal transmitted through a stubless-wired line can be restricted at minimum. On the other hand, according to the distributed chips wiring structure, the decrement of impedance is canceled by not only outer lines but also inner lines of a memory module board. Therefore, larger additional capacitance can be canceled.

While this invention has thus far been described in conjunction with a few embodiments thereof, it will be readily possible for those skilled in the art to put the this invention into various other manners.

For example, although the description mentioned above is made about a motherboard and a memory module board of a personal compute, it is easy for those who skilled in the art to adopt the present invention to another type of data bus.

In the description about the second embodiment, the wire of the memory module board has a redundant route which starts from the outer line, passes through the inner line between the DRAM chips, and ends to the outer line. However, the wire may have different redundant route.

What is claimed is:

1. A data bus system comprising:
   a first wire laid on a first board as a part of a signal line of a data bus;
   a second wire laid on a second board which is installed on the first board as a part of the signal line; and
   a semiconductor device embedded on the second board and connected with the second wire,
   wherein impedance of the second wire is larger than impedance of the first board, and
   wherein the second wire comprises a section at least one of whose width, thickness and length is decided according to the additional capacitance of the semiconductor device and the second board comprises at least one inner layer and at least one part of the section is laid on the inner layer.

2. The data bus system claimed in claim 1, wherein the first wire and second wire are connected with each other in a stubless wiring structure.

3. The data bus system claimed in claim 1, wherein the whole of the second wire corresponds to the section.

4. The data bus system claimed in claim 1, wherein:
   at least two semiconductor devices are embedded on the second board; and
   the section is prepared for the whole of the semiconductor devices.

5. The data bus system claimed in claim 1, wherein:
   at least two semiconductor devices are embedded on the second board;
   the second wire comprises the same number of the sections as the semiconductor devices; and
   each of the sections is prepared for one of the semiconductor devices.

6. A memory module board, on which at least one memory chip is embedded, for use in being plugged into a connector on a predetermined motherboard to establish a data bus to the memory chip,
   wherein an impedance of a wire on the memory module board is larger than an impedance of the motherboards,
   wherein the wire on the memory module board comprises at least one section, at least one of said section's width, thickness and length is decided according to additional capacitance of the memory chips, and the memory module board further comprises at least one inner layer and at least one part of the section is laid on the inner layer.

7. The memory module board claimed in claim 6, wherein the memory module board and the motherboard are connected with each other in a stubless wiring structure.

8. The memory module board claimed in claim 6, wherein the wire on the memory module board corresponds to the section.

9. The memory module board claimed in claim 6, wherein:
   at least two semiconductor devices are embedded on the second board; and
   the section is prepared for the whole of the semiconductor devices.

10. The memory module board claimed in claim 6, wherein:
    at least two semiconductor devices are embedded on the second board;
    the wire on the memory module board comprises the same number of the sections as the semiconductor devices; and
    each of the sections is prepared for one of the semiconductor devices.

11. A method of wiring a signal line of a data bus, comprising the steps of:
    laying first wires laid on a first board and second wires laid on at least one second board;
    installing the second board on the first board to connect the first and second wires with each other in series to establish a signal line;
    connecting at least one semiconductor device to the second wire; wiring a wire whose impedance is decided according to additional capacitance of the semiconductor device on the second board as the second wire in order to harmonize an impedance of the first board with an impedance of the second board;
    deciding according to the additional capacitance, a width, thickness and length of at least one section of the second wire; and
    laying on an inner layer of said second board at least one part of the section.

12. The method claimed in claim 11, wherein an impedance of the second wire is larger than the impedance of the first board.

13. The method claimed in claim 11, further comprising the step of connecting the first and second wires to each other in a stubless wiring structure.

14. The method claimed in claim 11, wherein the whole of the second wire corresponds to the section.

15. The method claimed in claim 14, further comprising the steps of:
    embedding at least two semiconductor devices on the second board; and
    preparing the section all of the semiconductor devices.

16. The method claimed in claim 14, further comprising the steps of:

embedding at least two semiconductor devices on the second board;

wherein the second wire comprises the same number of the sections as the semiconductor devices; and wherein each of the sections is prepared for one of the semiconductor devices.

* * * * *